United States Patent [19]

Miura et al.

[11] Patent Number: 5,793,067

[45] Date of Patent: Aug. 11, 1998

[54] HYBRID TRANSISTOR STRUCTURE WITH WIDENED LEADS FOR REDUCED THERMAL RESISTANCE

[75] Inventors: Takeshi Miura; Teruyuki Shimura; Manabu Katoh, all of Tokyo, Japan

[73] Assignee: Mitsubishi Denki Kabushiki Kaisha, Tokyo, Japan

[21] Appl. No.: 675,968

[22] Filed: Jul. 5, 1996

[30] Foreign Application Priority Data

Nov. 27, 1995 [JP] Japan ................. 7-307187

[51] Int. Cl.⁶ ........................... H01L 31/0328
[52] U.S. Cl. ................. 257/183; 257/197; 257/573; 257/579; 257/584
[58] Field of Search .................. 257/183, 197, 257/573, 578, 579, 584, 692

[56] References Cited

U.S. PATENT DOCUMENTS 5,373,185  12/1994  Sato ........................... 257/587

*Primary Examiner*—Tom Thomas
*Assistant Examiner*—Roy Potter
*Attorney, Agent, or Firm*—Leydig, Voit & Mayer, Ltd.

[57] ABSTRACT

An electrode lead of a transistor extends beyond other electrode leads of the transistor, is disposed adjacent to the corresponding electrode, and is disposed outside the other electrode leads for heat radiation. A wider part of the electrode lead may have a via hole or a thick metal plating for heat radiation. Further, the electrode is preferably grounded and is connected to an external input terminal to which heat is transferred.

18 Claims, 8 Drawing Sheets

1

HYBRID TRANSISTOR STRUCTURE WITH WIDENED LEADS FOR REDUCED THERMAL RESISTANCE

BACKGROUND OF THE INVENTION

1. Field of the Invention

The present invention relates to a semiconductor device, such as a heterojunction bipolar transistor, and, more particularly, to a structure of a semiconductor device, such as a heterojunction bipolar transistor having reduced thermal resistance.

2. Disclosure of the Background Art

In a heterojunction bipolar transistor, particularly in a multi-finger type transistor producing a high power output, the heat radiation characteristic of an operating area is important for improving power output and yield. FIG. 13(a) is a plan view and FIG. 13(b) is a sectional view respectively showing a heat radiation structure of a prior art heterojunction bipolar transistor. In FIG. 13(a) and FIG. 13(b), a heterojunction bipolar transistor is comprised of an emitter wiring 1, an emitter air bridge 4, a base electrode 5, a collector electrode 6, an emitter electrode 7, an emitter 8, a base 9, a collector 10, a semi-insulating substrate 11, a back side metal 12, and a via hole 14. As shown in the drawings, the conventional heterojunction bipolar transistor radiates heat using a via hole 14 having a very small area and located near the operating area where the emitter electrode 7, the base electrode 5, and the collector electrode 6 are located and, further, by minimizing the thickness of the substrate.

As described above, although a via hole is located near an operating area in a heat radiation structure of a conventional heterojunction bipolar transistor, the formation process is difficult because the via hole has to be formed in a very small area. Therefore, there is a limit in improving the heat radiation characteristics.

SUMMARY OF THE INVENTION

The present invention was made to solve the problems discussed above and has an object providing a semiconductor device, such as a heterojunction bipolar transistor, having a high yield and a high power output in which the heat radiation characteristics of the operating area of the semiconductor device, such as a heterojunction bipolar transistor, are improved, and thermal resistance is reduced.

According to one aspect of the present invention, a semiconductor device includes three electrodes, a first lead from a first of the electrodes disposed adjacent to a second of the electrodes. A second lead from the second electrode extends beyond the first lead where the second lead has a wider part for radiating heat.

In another aspect of the present invention, the semiconductor device includes in the first lead a widened planar part adjacent to the first electrode. The second lead from the second electrode extends beyond the first lead with an insulating layer disposed between the first and second leads.

In another aspect of the present invention, a semiconductor device comprises a heterojunction bipolar transistor that includes a plurality of elemental transistors, each elemental transistor including three electrodes, a first lead from a first electrode of each elemental transistor being disposed adjacent to the first electrode, the first leads being connected to each other. A second lead from a second of the electrodes of each elemental transistor extends beyond the first lead and is disposed outside the first lead and includes a wider part for radiating heat. The second leads are connected to each other.

In a further aspect of the present invention, a semiconductor device comprises a heterojunction bipolar transistor that includes a plurality of elemental transistors, each elemental transistor including three electrodes, a first lead from a first electrode of each elemental transistor having a widened planar form adjacent to the first electrode, and the first leads are connected to each other. A second lead from a second of the electrodes of each elemental transistor extends beyond the first lead with an insulating layer disposed between the first and second leads and is disposed outside the first lead and having a wider part for radiating heat. The second leads are connected to each other.

In another aspect of the present invention, a semiconductor device as described above includes a via hole in the wider part of the second lead.

According to another aspect of the present invention, a semiconductor device as described above includes a thick metal plating on the wider part of the second lead.

In another aspect of the present invention, a semiconductor device as described above includes armor for protecting the semiconductor device wherein the thick metal plating is in contact with the armor.

According to another aspect of the present invention, in a semiconductor device as described above, the wider part of the second lead is connected to an external input terminal.

In another aspect of the present invention, in a semiconductor device as described above, the second electrode is connected to a ground potential.

According to another aspect of the present invention, in a semiconductor device as described above, the second electrode is an emitter electrode of a heterojunction bipolar transistor.

In another aspect of the present invention, in a semiconductor device as described above, the second electrode is a base electrode of a heterojunction bipolar transistor.

In still another aspect of the present invention, in a semiconductor device as described above, the materials of the transistor are selected from a group consisting of Si, Si/SiGe/Ge, Si/SiC, Si/SiC/SiGe, GaAs/AlGaAs, GaAs/AlGaAs/GaInP, GaAs/GaInP, GaAs/GaInP/AlGaInP, GaAs/GaAsP, GaAs/GaInAs/GaAsP, InP/GaInAs, InP/GaInAs/AlInAs and InP/AlInAs, GaAs/Ge, and InP/InGaAsP.

Further, another aspect of the present invention includes a semiconductor device comprising a heterojunction bipolar transistor which includes a plurality of elemental transistors including three electrodes, a first lead from a first electrode of each elemental transistor surrounding an electrode area of each elemental transistor, the first electrodes are connected to each other, and a second lead from a second electrode of each elemental transistor extends beyond the first lead and is disposed outside the first lead.

Other features and advantages of the invention will be apparent from the following description.

BRIEF DESCRIPTION OF THE DRAWINGS

Throughout the drawings, the same reference numerals refer to the same or like elements.

DETAILED DESCRIPTION OF THE PREFERRED EMBODIMENTS

Figure 1A:
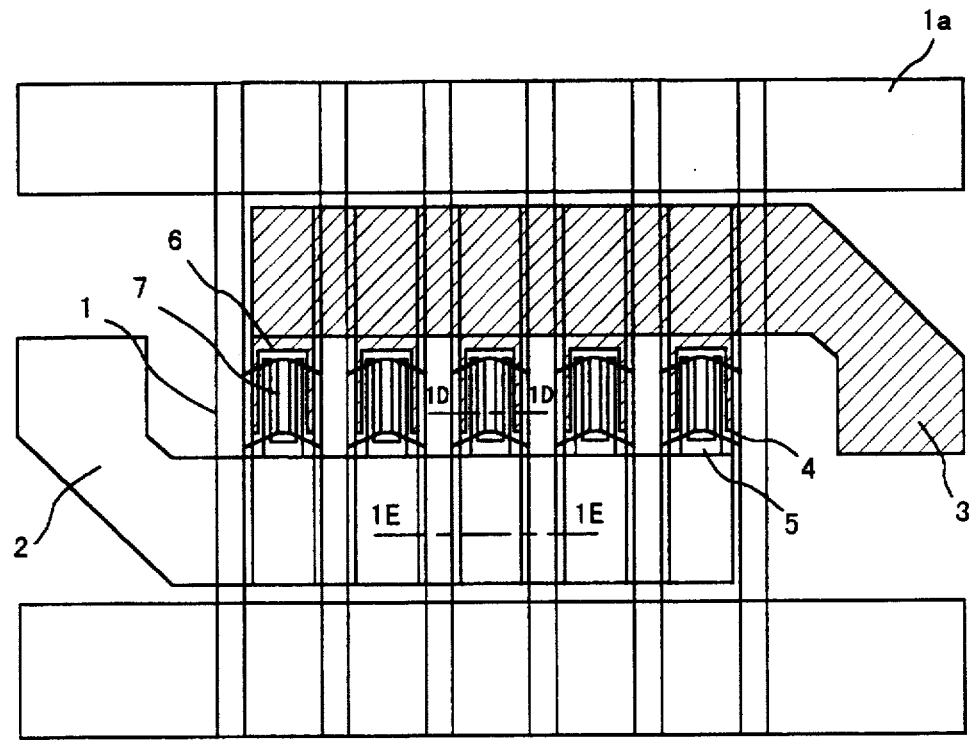
FIG. 1(A), FIG. 1(B), and FIG. 1(C) are partial plan views
Figure 1B:
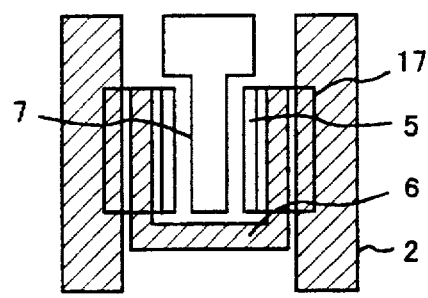
Figure 1C:
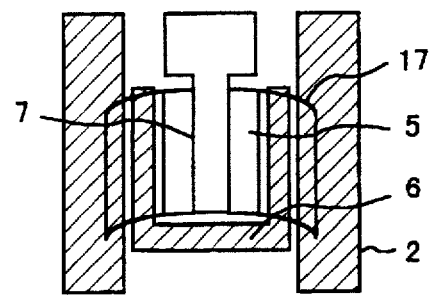
Figure 1D:
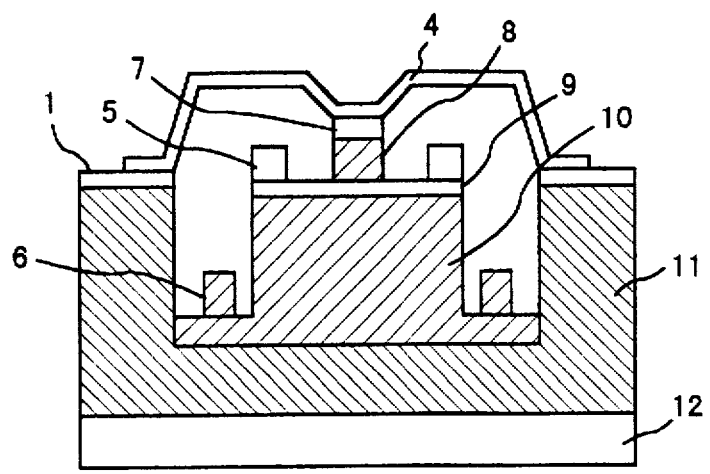
FIG. 1(D) and FIG. 1(E) are partial sectional views, respectively taken along lines 1D—1D and 1E—1E of FIG. 1(A), showing a structure of a heterojunction bipolar transistor in accordance with the present invention.
Figure 1E:
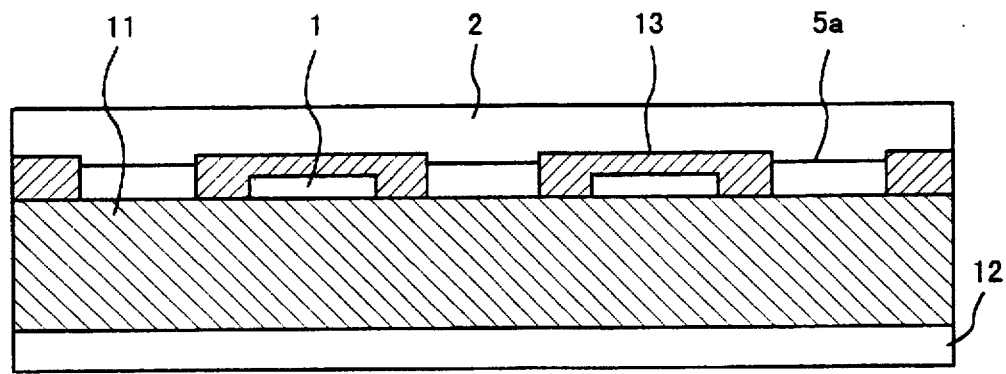

A preferred embodiment of the present invention is hereinafter described. FIGS. 1(A) through 1(E) illustrate a structure, in particular a lead structure, of a heterojunction bipolar transistor having five fingers, as an example in accordance with the present invention. More specifically, FIGS. 1(A), 1(B), and 1(C) are partial plan views of a five finger heterojunction bipolar transistor. FIG. 1(D) is a sectional view taken along the line 1D—1D in FIG. 1(A), and FIG. 1(E) is a sectional view taken along the line 1E—1E in FIG. 1(A). In the drawings, a heterojunction bipolar transistor includes an emitter lead 1, a common emitter lead 1a, a base lead 2, a collector lead 3, an emitter air bridge 4e, a base electrode 5, a base electrode contact 5a, a collector electrode 6, an emitter electrode 7, an emitter 8, a base 9, a collector 10, a semi-insulating substrate 11, a back side metal 12, an insulating layer 13, and a via hole 14.

In this embodiment, the heterojunction bipolar transistor has a structure in which one end of the emitter air bridge 4 is connected thermally and electrically to the emitter electrode 7 and another end of the emitter air bridge 4 is connected to the emitter lead 1 on the semi-insulating semiconductor substrate 11, see FIG. 1(D). In this structure, it is to be noted that the emitter lead 1 can extend under the base lead 2, and the collector lead 3 without electrical contact, see FIG. 1(E), and reaches a wider part distant from the operating area, see FIG. 1(A). With this structure, heat generated in the transistor is radiated or transferred to the substrate side 11 efficiently, and thermal resistance is reduced. In this embodiment, the emitter electrode is preferably connected to ground potential through the wider part of the electrode lead.

Next, a process of manufacturing the heterojunction bipolar transistor in accordance with the present invention is described. FIGS. 2(A) and 2(B) through FIGS. 6(A) and 6(B) show the steps of manufacturing a heterojunction bipolar transistor of GaAs/AlGaAs. FIG. 2(A), FIG. 3(A), FIG. 4(A), FIG. 5(A), and FIG. 6(A) are partial plan views of the electrodes of the transistors and FIG. 2(B), FIG. 3(B), FIG. 4(B), and FIG. 5B are sectional views taken along the lines 2B—2B, 3B—3B, 4B—4B, and 5B—5B in FIG. 2(A), FIG. 3(A), FIG. 4(A), and FIG. 5(A), respectively. FIG. 6(B) and FIG. 6(C) are sectional views taken along the line 6B—6B in FIG. 6(A).

Figure 2A:
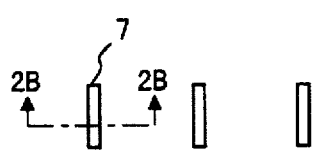
FIG. 2(A) is a partial plan view and FIG. 2(B) is a sectional view taken along line 2B—2B of FIG. 2(A), respectively showing a manufacturing process of a heterojunction bipolar transistor in accordance with the present invention.
Figure 2B:
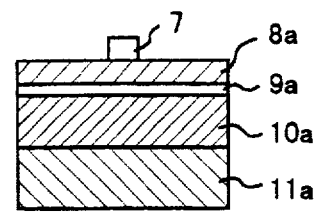

First, as shown in FIG. 2(B), a n-type GaAs collector layer 10, a p-type GaAs base layer 9, and a n-type AlGaAs emitter layer 8 are grown on a GaAs semi-insulating substrate 11 by molecular beam epitaxy (MBE), for example. An emitter electrode 7 is formed and patterned on the emitter layer 8.

Figure 3A:
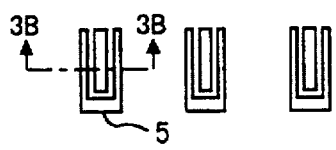
FIG. 3(A) is a partial plan view and FIG. 3(B) is a sectional view taken along line 3B—3B of FIG. 3(A), respectively showing a manufacturing process of a heterojunction bipolar transistor in accordance with the present invention.
Figure 3B:
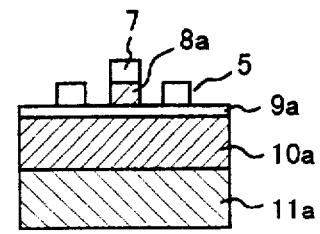

Then, as shown in FIG. 3(B), after masking the emitter electrode 7, the n-type AlGaAs emitter layer 8 is etched, whereby the p-type GaAs base layer 9 is exposed. Further, the base electrode 5 is formed on a surface of the p-type GaAs base layer 9 by the lift-off method or the like.

Figure 4A:
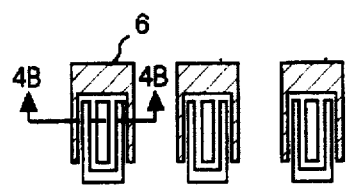
FIG. 4(A) is a partial plan view and FIG. 4(B) is a sectional view taken along line 4B—4B of FIG. 4(A), respectively showing a manufacturing process of a heterojunction bipolar transistor in accordance with the present invention.
Figure 4B:
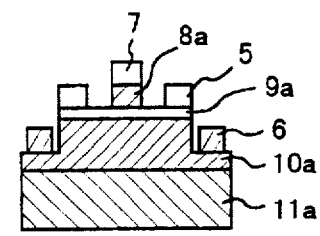
Figure 5A:
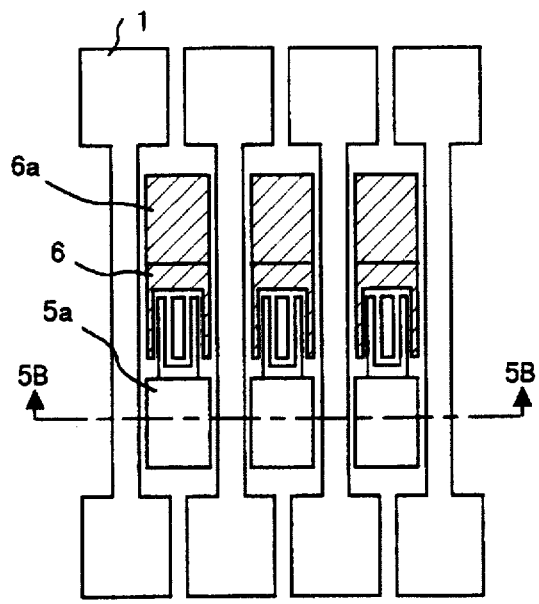
FIG. 5(A) is a partial plan view and FIG. 5(B) is a sectional view taken along line 5B—5B of FIG. 5(A), respectively showing a manufacturing process of a heterojunction bipolar transistor in accordance with the present invention.
Figure 5B:
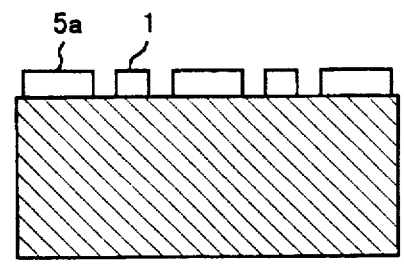

Further, the n-type GaAs collector layer 10 is etched, as shown in FIG. 4(B), and the collector electrode 6 is formed on the remaining n-type GaAs collector layer 10. Then, as shown in FIGS. 5(A) and 5(B), the emitter leads 1 are formed in parallel, between respective operating areas or electrode areas (portions where the emitter electrode, base electrode, and collector electrode are located), and the contact 5a of the base electrode and the contact 6a of the collector electrode are formed in contact with the base electrode 5 and the collector electrode 6, respectively.

Figure 6A:
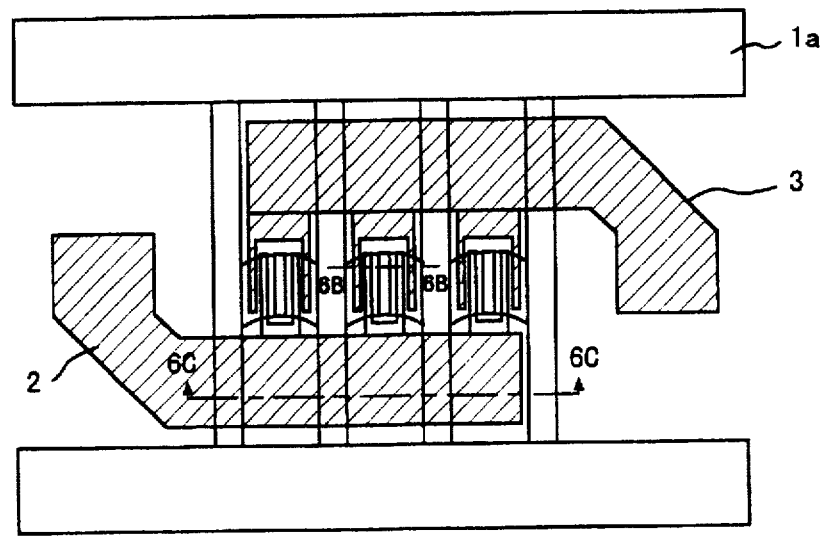
FIG. 6(A) is a partial plan view and FIG. 6(B) and FIG. 6(C) are sectional views taken along lines 6B—6B and 6C—6C of FIG. 6(A), respectively, showing a manufacturing process of a heterojunction bipolar transistor in accordance with the present invention.
Figure 6B:
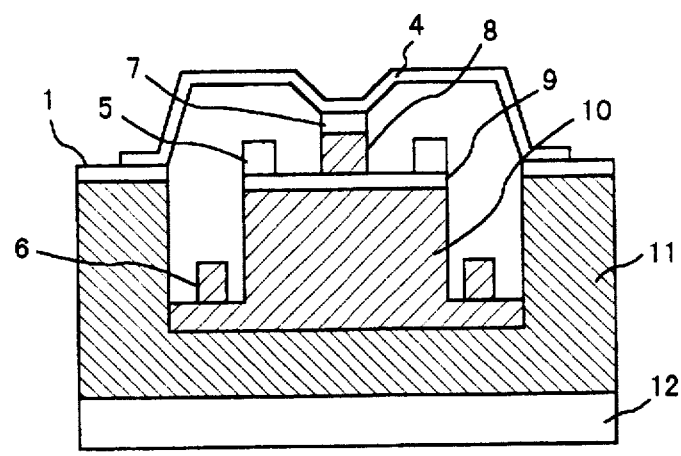
Figure 6C:
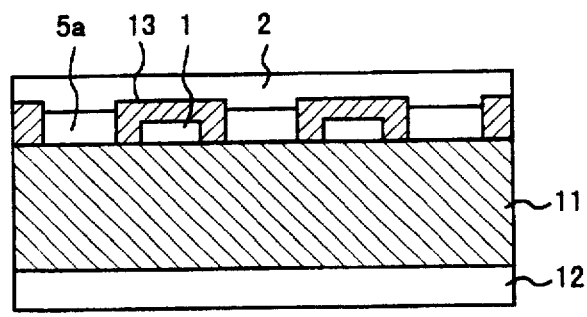

Subsequently, as shown in FIG. 6(A), an emitter common lead 1a is formed, connected to each emitter lead 1. Furthermore, a base lead 2 is connected to each contact lead 5a of the base electrode, and a collector lead 3 is connected to each contact lead 6a of the collector electrode. The base lead 2 and the collector lead 3 are electrically isolated from the emitter lead 1.

The vertical relationship of the emitter lead 1 to the base lead 2 and the collector lead 3 may be inverted from the arrangement of the embodiment described above, that is, the emitter lead 1 may be formed over the base lead 2 and the collector lead 3 without electrical contact.

According to the present invention as described above, the emitter common lead 1a provides for heat radiation from a heterojunction bipolar transistor and has a large area in a wider part, so that the thermal resistance is reduced and power output and yield of the heterojunction bipolar transistor are improved. Further, the emitter leads extend to a wider part so that processes thereafter become easy, reducing the manufacturing cost.

Figure 7A:
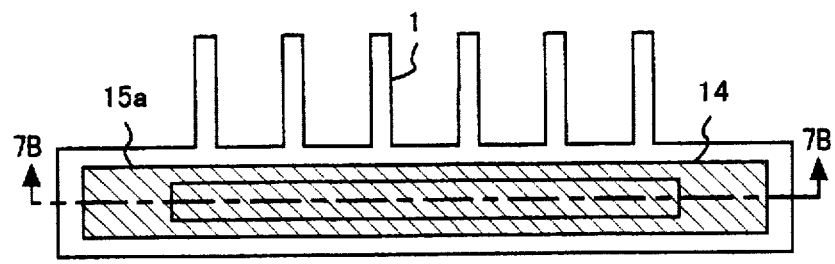
FIG. 7(A) is a partial plan view and FIG. 7(B) is a sectional view taken along line 7B—7B of FIG. 7(A), respectively showing a manufacturing process of a heterojunction bipolar transistor in accordance with the present invention.
Figure 7B:
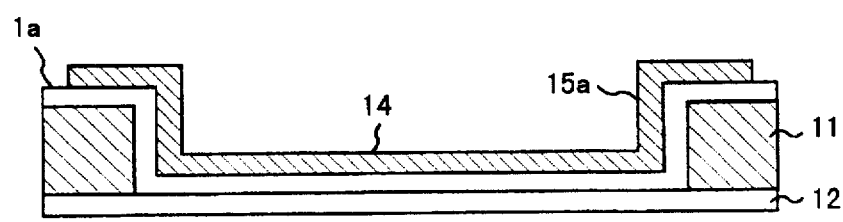

Next, there is shown another embodiment of the present invention. FIGS. 7(A) and 7(B) are views showing a structure of a heterojunction bipolar transistor according to the invention. FIG. 7(A) is a partially plan view and FIG. 7(B) is a sectional view taken along the line 7B—7B in FIG. 7(A). As shown in the drawings, a heterojunction bipolar transistor includes a via hole 14 in the large area portion of the emitter lead 1a and a metal plating part 15a.

In this embodiment, the heterojunction bipolar transistor is further provided with a large via hole 14 in the larger portion 1a of the emitter lead 1, and the emitter lead 1a is thermally connected to the back side metal 12. Thus, heat generated in the device may be transferred to the substrate side through the via hole 14 efficiently, reducing thermal resistance.

Figure 8A:
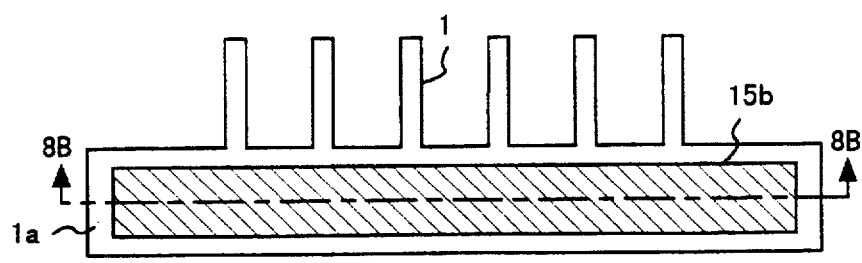
FIG. 8(A) is a partial plan view and FIG. 8(B) is a sectional view taken along line 8B—8B of FIG. 8(A), respectively showing a manufacturing process of a heterojunction bipolar transistor in accordance with the present invention.
Figure 8B:
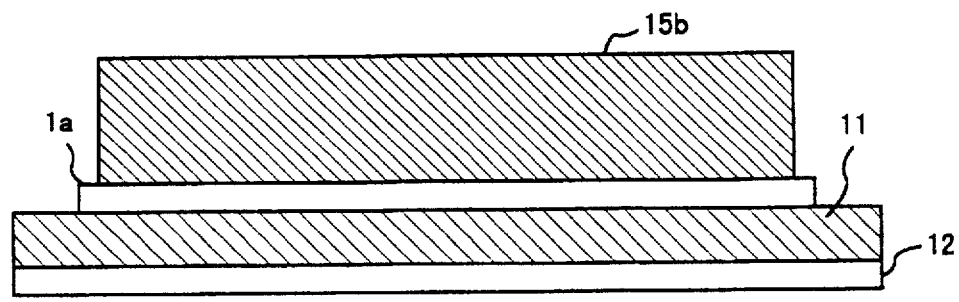

Next, there is shown another embodiment of this invention. FIGS. 8(A) and 8(B) are views showing a structure of a heterojunction bipolar transistor of this embodiment. FIG. 8(A) is a partial plan view, although a substrate 11 and a back side metal 12 are not illustrated, and FIG. 8(B) is a sectional view taken along the line 8B—8B in FIG. 8(A).

As shown in the drawings, a heterojunction bipolar transistor is provided with a thick metal plating 15b in a larger area portion 1a of an emitter lead 1. The metal plating 15b is as thick as possible, whereby the metal plating 15b may absorb and transfer heat generated in the operating area of the heterojunction bipolar transistor and radiate heat efficiently to the substrate side, reducing thermal resistance.

Figure 9:
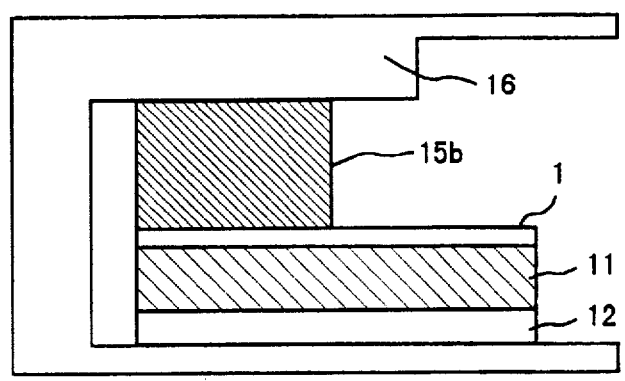
FIG. 9 is a partial sectional view showing a structure of a heterojunction bipolar transistor in accordance with the present invention.

Next, there is shown another embodiment of this invention. FIG. 9 is a partially sectional view showing a structure of a heterojunction bipolar transistor according to the invention. As shown in the drawing, a heterojunction bipolar transistor is provided with a thick metal plating 15b over a large area portion 1a of the emitter lead 1 and an armor 16. The metal plating 15b is as thick as possible in the large area portion 1a of the emitter lead 1, and the metal plating 15b is in contact with the armor 16. Thus, heat generated in the transistor may be transferred to the armor 16 and to the substrate 11 with high efficiency, reducing thermal resistance more efficiently.

Figure 10:
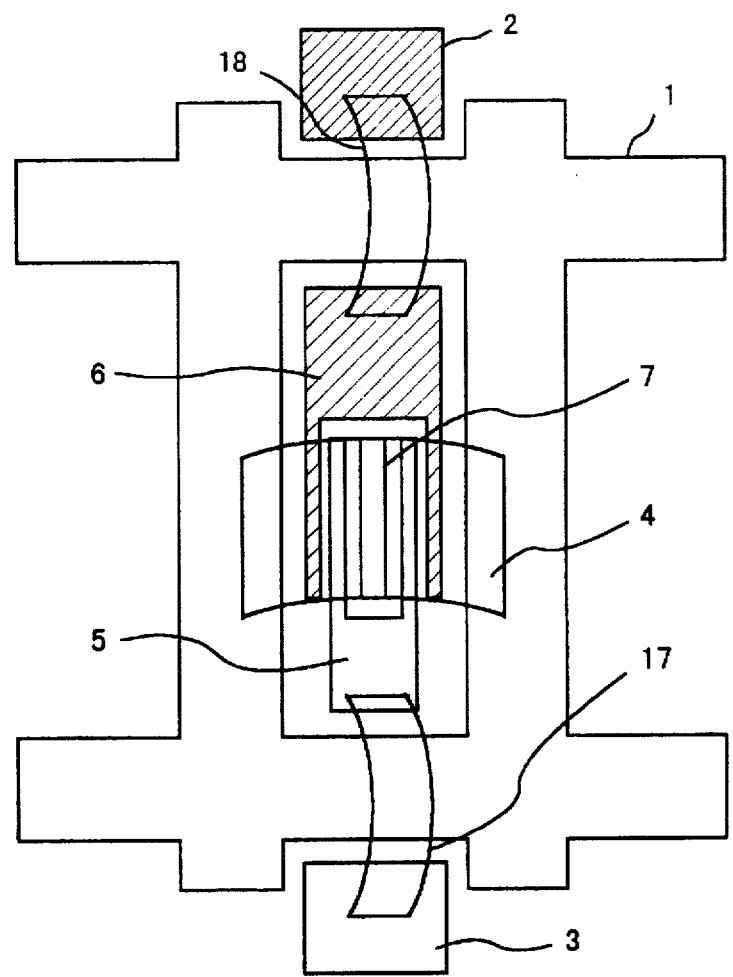
FIG. 10 is a partial plan view showing a structure of a heterojunction bipolar transistor in accordance with the present invention.

Next, there is shown another embodiment of this invention. FIG. 10 is a partial plan view showing a structure of an operating area of a heterojunction bipolar transistor according to this invention. As shown in the drawing, a heterojunction bipolar transistor is provided with an emitter air bridge 4, a base air bridge 17, and a collector air bridge 18. In this embodiment, the heterojunction bipolar transistor is provided with a wide emitter lead 1 surrounding an operating area or electrode area where the emitter electrode 7, the base electrode 5, and the collector electrode 6 are disposed. Thus, heat generated in the transistor may be transferred to the substrate 11 with high efficiency, reducing thermal resistance.

Figure 11A:
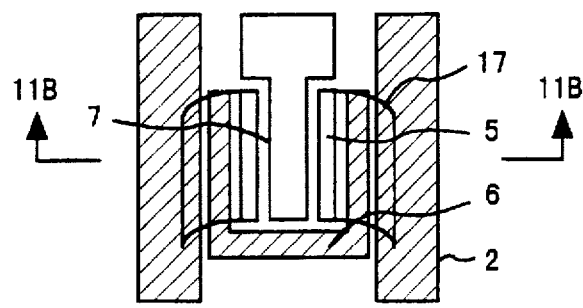
FIG. 11(A) is a partial plan view and FIG. 11(B) is a sectional view respectively showing a structure of a heterojunction bipolar transistor in accordance with the present invention.
Figure 11B:
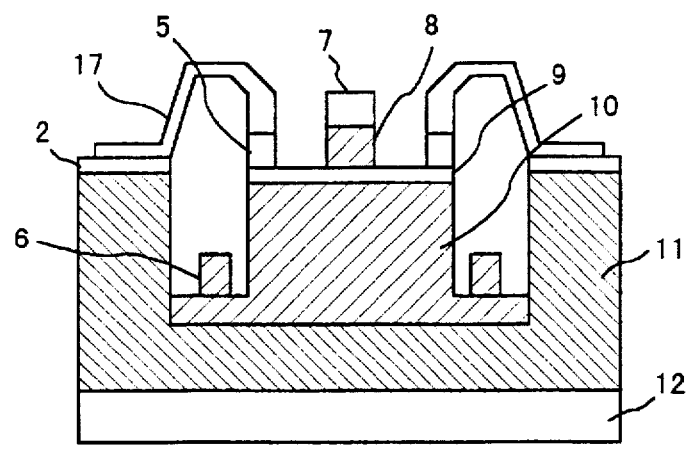

Next, there is shown another embodiment of this invention. Although the heterojunction bipolar transistors in the foregoing embodiments have grounded emitters, the heat radiation structures of the heterojunction bipolar transistors described for the previous embodiments are also applicable to a heterojunction bipolar transistor operated by base grounding. FIGS. 11(A) and 11(B) are views showing a structure of the operating area of a heterojunction bipolar transistor according to the invention. FIG. 11(A) is a partial plan view and FIG. 11(B) is a partially sectional view taken along line 11B—11B of FIG. 11(A). As shown in the drawings, a heterojunction bipolar transistor with a grounded base includes the base lead 2 having a large area and a base air bridge 17. The base air bridge 17 extends from the base electrode 5 to the large area base lead 2 which, in turn, extends to a wider part in the same way as in FIG. 1(A). Thus, heat generated in the device may be transferred to the substrate 11 through the base lead 2 with high efficiency, reducing thermal resistance.

Figure 12:
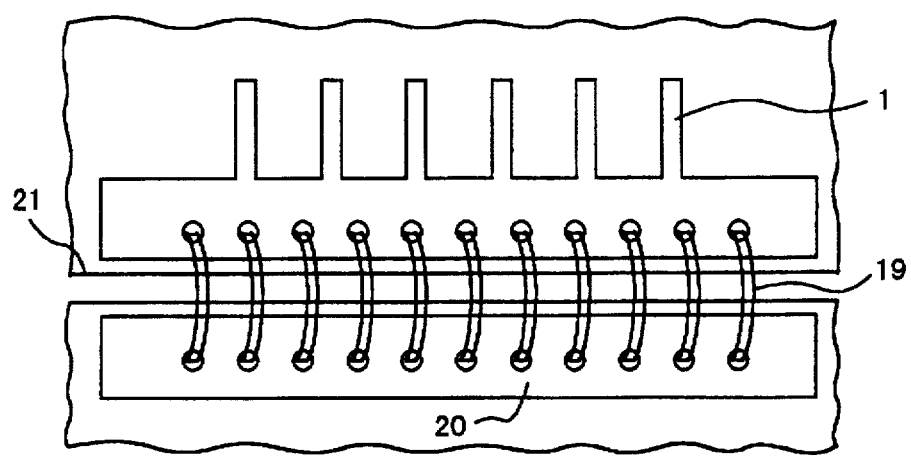
FIG. 12 is a partial plan view showing a structure of a heterojunction bipolar transistor in accordance with the present invention.
Figure 13A:
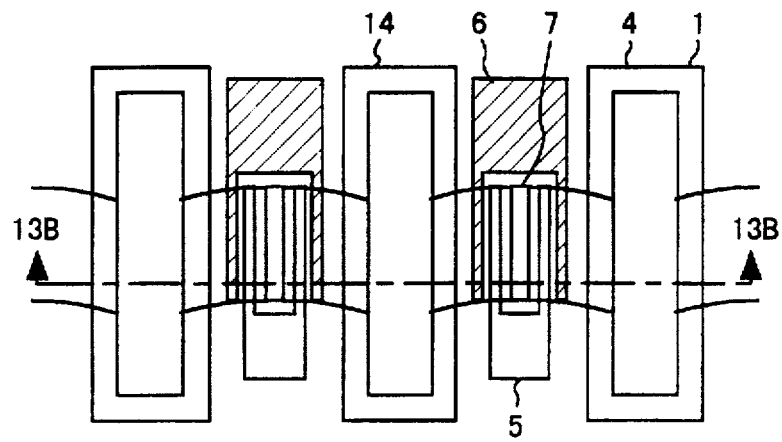
FIG. 13(A) is a partial plan view and FIG. 13(B) is a sectional view taken along line 13B—13B of FIG. 13(A), respectively showing a structure of a heterojunction bipolar transistor in accordance with the prior art.
Figure 13B:
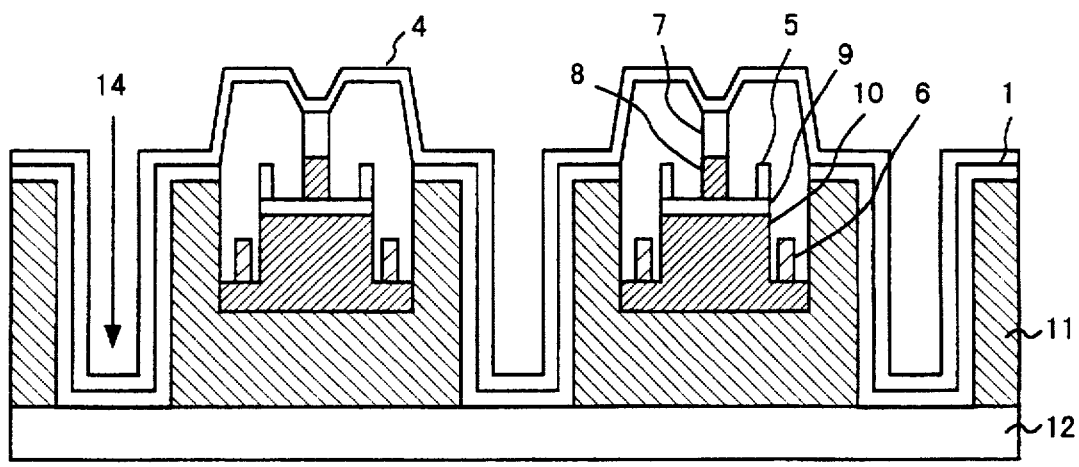

Next, there is shown another embodiment of this invention. FIG. 12 is a partial plan view showing a structure of a heterojunction bipolar transistor of this invention. As shown in the drawing, a heterojunction bipolar transistor is provided with an emitter lead 1 having a large area portion 1a which is parallel to a scribe line (chip end) 21 of a chip cut out of a wafer. Wires 19, or at least one wire 19, are disposed close to each other with equal lengths to bridge the large area portion 1a of the emitter lead 1 and an external input electrode 20. Thus, heat generated in the device may be transferred outside through the plurality of wires 19 with high efficiency, reducing heat resistance as a whole.

In the transistors of the foregoing embodiments, the materials of the emitter/base/collector layers are AlGaAs/GaAs/GaAs. However, heterojunction bipolar transistors in accordance with the present invention are not limited to these materials or this combination.

The combination of emitter/base/collector materials may be Si materials, such as Si/Si/Si, or Si/SiGe/Si materials, such as Si/SiGe/Si, Si/Ge/SiGe, SiGe/Ge/SiGe, and SiGe/Ge/Ge.

It may also be Si/SiC materials, such as SiC/Si/Si, SiC/SiGe/Si materials, GaAs/AlGaAs materials, such as AlGaAs/GaAs/GaAs, GaAs/AlGaAs/GaInP materials, GaAs/GaInP materials, such as GaInP/GaAs/GaAs, GaAs/GaInP/AlGaInP materials, such as AlGaInP/GaInP/GaAs, AlGaInP-GaInP/GaInP/GaAs, AlGaInP/GaAs/GaAs, and AlGaInP-GaInP/GaAs/GaAs, GaAs/GaAsP materials, such as GaAsP/GaAs/GaAs, GaAs/GaInAs/GaAsP materials, such as GaAsP/GaInAs/GaAs, InP/GaInAs materials, such as InP/GaInAs/InP, InP/GaInAs/AlInAs materials, such as Al(Ga)InAs/GaInAs/InP, InP/AlInAs materials, such as Al(Ga)InAs/InP/InP, GaAs/Ge materials, such as GaAs/GaAs/Ge, or InP/InGaAsP materials, such as InP/InP/InGaAsP.

Further, the invention may be applied to both npn type and pnp type heterojunction bipolar transistors in the combinations mentioned above.

Obviously, many modifications and variations of the present invention are possible in light of the above teachings. It is, therefore, to be understood that, within the scope of the appended claims, the invention may by practiced otherwise than as specifically described.

We claim:

1. A semiconductor device comprising a hybrid transistor structure including a plurality of elemental transistors, each elemental transistor including three electrodes, a first lead from a first of the electrodes of each elemental transistor being disposed adjacent to the first electrode, the first leads being connected to each other, and a second lead from a second of the electrodes of each elemental transistor extending beyond the first lead and being disposed outside the first lead and including a wider part for radiating heat, the second leads being connected to each other.

2. A semiconductor device comprising a heterojunction bipolar transistor structure including a plurality of elemental transistors, each elemental transistor including three electrodes, a first lead from a first of the electrodes of each elemental transistor having a widened planar form adjacent to the first electrode, the first leads being connected to each other, and a second lead from a second of the electrodes of each elemental transistor extending beyond the first lead with an insulating layer disposed between the first and second leads and disposed outside the first lead and having a wider part for radiating heat, the second leads being connected to each other.

3. The semiconductor device as set forth in claim 1 including a via hole in the wider part of the second lead.

4. The semiconductor device as set forth in claim 1 including a metal plating disposed on the wider part of the second lead.

5. The semiconductor device set forth in claim 4 including armor for protecting the semiconductor device wherein the metal plating is in contact with the armor.

6. The semiconductor device as set forth in claim 1 wherein the wider part of the second lead is connected to an external input terminal.

7. The semiconductor device as set forth in claim 1 wherein the second electrode is connected to a ground potential.

8. The semiconductor device as set forth in claim 1 wherein the second electrode is an emitter electrode of a heterojunction bipolar transistor.

9. The semiconductor device as set forth in claim 1 wherein the second electrode is a base electrode of a heterojunction bipolar transistor.

10. The semiconductor device as set forth in claim 1 wherein the materials of the transistor are selected from the group consisting of Si, Si/SiGe/Ge, Si/SiC, Si/SiC/SiGe, GaAs/AlGaAs, GaAs/AlGaAs/GaInP, GaAs/GaInP, GaAs/GaInP/AlGaInP, GaAs/GaAsP, GaAs/GaInAs/GaAsP, InP/GaInAs, InP/GaInAs/AlInAs, InP/AlInAs, GaAs/Ge, and InP/InGaAsP.

11. A semiconductor device comprising a heterojunction bipolar transistor including a plurality of elemental transistors, each elemental transistor including three electrodes, a first lead from a first of the electrodes of each elemental transistor surrounding an electrode area of each elemental transistor, the first electrodes being connected to each other, and a second lead from a second of the electrodes of each elemental transistor extending beyond the first lead and being disposed outside the first lead.

12. A semiconductor device comprising:
a semi-insulating semiconductor substrate having front and back sides;
a back side metal on the back side of the semi-insulating substrate;
a plurality of bipolar transistor elements on the front side of the semi-insulating substrate and disposed along a first direction, each bipolar transistor having an emitter region, a base region, and a collector region;
a plurality of emitter electrodes, each emitter electrode contacting and electrically connected to the emitter region of a corresponding bipolar transistor element;
a plurality of base electrodes, each base electrode contacting and electrically connected to the base region of a corresponding bipolar transistor element, and disposed outside the emitter region of the corresponding bipolar transistor element, along the first direction;
a plurality of collector electrodes, each collector electrode contacting and electrically connected to the collector region of a corresponding bipolar transistor element, and disposed outside the base region of the corresponding bipolar transistor element, along the first direction;
an emitter lead having a plurality of lead parts, each lead part being disposed between neighboring pairs of bipolar transistor elements and extending along a second direction normal to the first direction;
a plurality of emitter bridges, each emitter bridge being electrically connected between the emitter electrode of a corresponding bipolar transistor element and the lead part disposed adjacent the corresponding bipolar transistor element, and bridgingly crossing the base electrode and the collector electrode of the corresponding bipolar transistor element;
a common lead electrically connected to the plurality of lead parts, disposed at a first end of the plurality of lead parts along the second direction, and extending along the first direction;
a base lead electrically connected to the plurality of base electrodes and disposed at a first end of the plurality of bipolar transistor elements along the second direction and extending along the first direction; and
a collector lead electrically connected to the plurality of collector electrodes, disposed at a second end of the plurality of bipolar transistor elements along the second direction, and extending along the first direction.

13. The semiconductor device as set forth in claim 12 wherein the common lead is wider than the lead part.

14. The semiconductor device as set forth in claim 12 further comprising a via hole in the semi-insulating substrate under the common lead.

15. The semiconductor device as set forth in claim 14 wherein the back side metal has an exposed surface at the via hole, and the common lead contacts the exposed surface of the back side metal.

16. The semiconductor device as set forth in claim 14 comprising a metal layer on the common lead.

17. The semiconductor device as set forth in claim 12 comprising armor for protecting the semiconductor device, and a metal layer on the common lead and contacting the armor.

18. A semiconductor device comprising:
a semi-insulating semiconductor substrate having front and back sides;
a back side metal on the back side of the semi-insulating substrate;
a plurality of bipolar transistor elements on the front side of the semi-insulating substrate and disposed along a first direction, each bipolar transistor having an emitter region, a base region, and a collector region;
a plurality of emitter electrodes, each emitter electrode contacting and electrically connected to the emitter region of a corresponding bipolar transistor element;
a plurality of base electrodes, each base electrode contacting and electrically connected to the base region of a corresponding bipolar transistor element, and disposed outside the emitter region of the corresponding bipolar transistor element, along the first direction;
a plurality of collector electrodes, each collector electrode contacting and electrically connected to the collector region of a corresponding bipolar transistor element, and disposed outside the base region of the corresponding bipolar transistor element, along the first direction;
an emitter lead having a plurality of lead parts surrounding respective bipolar transistor elements; and
a plurality of emitter bridges, each emitter bridge electrically connecting the emitter electrode of the corresponding bipolar transistor element and the lead part disposed adjacent the corresponding bipolar transistor element, and bridgingly crossing the base electrode and the collector electrode of the corresponding bipolar transistor element.

* * * * *

UNITED STATES PATENT AND TRADEMARK OFFICE
CERTIFICATE OF CORRECTION

PATENT NO. : 5,793,067
DATED : August 11, 1998
INVENTOR(S) : Miura et al.

It is certified that error appears in the above-identified patent and that said Letters Patent is hereby corrected as shown below:

Column 6, Line 53, change "hybrid" to

--heterojunction bipolar--.

Signed and Sealed this

First Day of December, 1998

Attest:

BRUCE LEHMAN

*Attesting Officer*  *Commissioner of Patents and Trademarks*